(12) United States Patent
Nakagawa et al.

(10) Patent No.: US 7,112,071 B2
(45) Date of Patent: Sep. 26, 2006

(54) STRUCTURE FOR ATTACHING A TERMINAL TO A CIRCUIT BOARD

(75) Inventors: Tooru Nakagawa, Mie (JP); Kazuhiro Yamamoto, Mie (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 0 days.

(21) Appl. No.: 11/290,558

(22) Filed: Dec. 1, 2005

(65) Prior Publication Data

US 2006/0141825 A1 Jun. 29, 2006

(30) Foreign Application Priority Data

Dec. 24, 2004 (JP) ............................. 2004-374761

(51) Int. Cl.
*H01R 12/00* (2006.01)

(52) U.S. Cl. ........................................................ 439/82

(58) Field of Classification Search .................. 439/78, 439/81, 82, 83, 84, 76.2
See application file for complete search history.

(56) References Cited

U.S. PATENT DOCUMENTS

| | | | |
|---|---|---|---|
| 5,518,427 A * | 5/1996 | Kan et al. .................... 439/736 |
| 5,607,313 A * | 3/1997 | Nyman ......................... 439/83 |
| 5,624,269 A * | 4/1997 | Kanamori .................... 439/83 |
| 6,062,916 A * | 5/2000 | Gladd et al. ................. 439/751 |
| 6,224,399 B1 * | 5/2001 | Yacoub ........................ 439/83 |
| 6,280,253 B1 * | 8/2001 | Kraus et al. ................. 439/621 |
| 6,638,082 B1 * | 10/2003 | Belopolsky et al. .......... 439/83 |
| 6,643,134 B1 | 11/2003 | Ashiya et al. |
| 6,659,812 B1 * | 12/2003 | Gessford et al. ............ 439/851 |
| 6,671,173 B1 | 12/2003 | Ashiya et al. |
| 6,790,051 B1 * | 9/2004 | Secall et al. .................. 439/78 |
| 6,891,463 B1 | 5/2005 | Nagaoka |
| 6,942,499 B1 * | 9/2005 | Tanaka et al. ............. 439/76.2 |
| 6,974,329 B1 * | 12/2005 | Henneberg .................... 439/59 |
| 2005/0136710 A1 * | 6/2005 | Adell ............................. 439/81 |

* cited by examiner

*Primary Examiner*—Ross Gushi
(74) *Attorney, Agent, or Firm*—Oliff & Berridge, PLC (57) ABSTRACT

In a structure for attaching a circuit board terminal to a circuit board, stress is minimized in a soldered portion on a circuit section upon inserting and drawing an electrical element into and from the circuit board. The attaching structure including a holding member mounted on and secured to a circuit board, a bus bar that has a base portion supported on the holding member and a leg portion that passes one or more through-holes and to be soldered on a circuit section, and a circuit board terminal that has a base portion to be connected to the bus bar and a connection portion adapted to be coupled to a terminal of an electrical element. The bus bar is provided on the base portion with elastic tongue pieces that can contact elastically with a circuit board terminal. The circuit board terminal is connected through the bus bar to the circuit section.

4 Claims, 7 Drawing Sheets

STRUCTURE FOR ATTACHING A TERMINAL TO A CIRCUIT BOARD

Patent Application No. JP 2004-374761, filed Dec. 24, 2004 in Japan, is hereby incorporated by reference in its entirety.

This invention relates to a structure for attaching a terminal to a circuit board in which a soldered portion connected to the circuit board is not subject to stress upon inserting and drawing an electrical element into and from the circuit board terminal.

BACKGROUND

Figure 7:
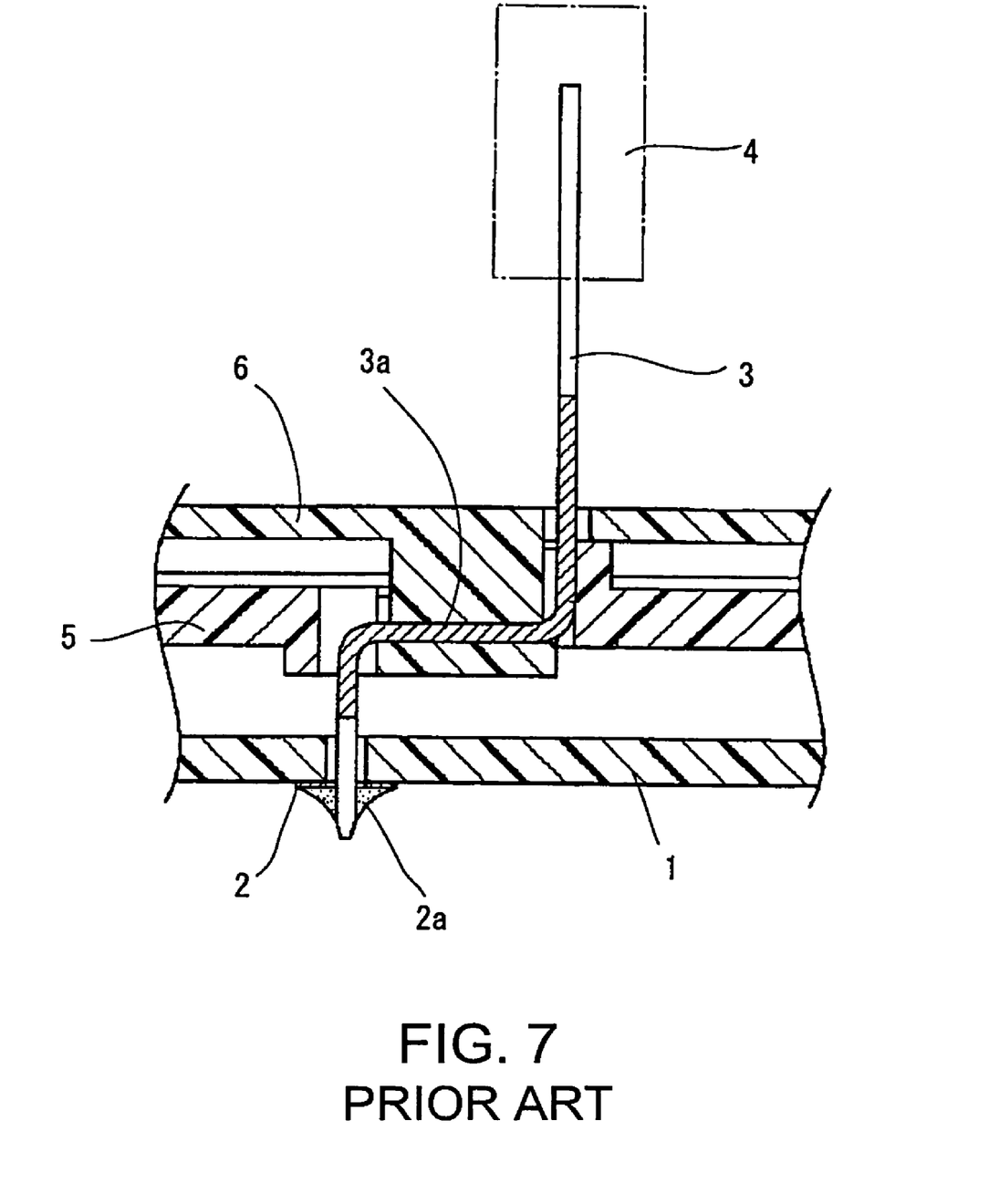
FIG. 7 is a sectional view of a conventional structure of attaching a terminal to a circuit board.

As shown in FIG. 7, generally, in order to connect an electrical element 4 to a circuit section 2 formed on a circuit board 1, a terminal 3 is supported on the circuit board 1 with a lower end of the terminal 3 being secured to a soldered portion 2a on the circuit section 2 and a terminal portion of the electrical element 4 is inserted into the other end of the terminal 3 (see Japanese Laid-Open Patent Application No. 2002-270986 (JP-A-2002-270986)). Also, the terminal 3 is formed into a crank-like configuration and includes a flat portion 3a parallel to the circuit board 1. The flat portion 3a is clamped between a terminal plate 5 and a plate cover 6 that are parallel to the circuit board 1. This structure can alleviate stress on the soldered portion 2a and reduce cracking of the soldered portion 2a when the electrical element 4 is inserted into or drawn out from the terminal 3.

SUMMARY

The above structure can reduce the stress to the soldered portion 2a upon inserting and drawing the electrical element 4 into and from the terminal 3. However, it was difficult to completely overcome a problem in which a stress acts on the soldered portion 2a to cause a crack, since the terminal 3 is formed of a single member extending from a portion connected to the electrical element 4 to the soldered portion 2a.

In view of the above problems, an object of exemplary embodiments of the present invention is to provide a structure for attaching a terminal to a circuit board in which a soldered portion on a circuit board section is not subject to a stress upon inserting and drawing an electrical element into and from the terminal.

In order to overcome the above problem, exemplary embodiments of the present invention provide a structure for attaching a terminal to a circuit board, comprising: a circuit board provided with a predetermined circuit section; a holding member made of an insulation material and mounted on and secured to the circuit board; a bus bar made of a metallic material and having a base portion supported on the holding member and a leg portion that passes throughholes formed in the holding member and the circuit board to be soldered on the circuit section; and a terminal that has a base portion to be connected to the bus bar and a connection portion adapted to be coupled to a terminal of an electrical element. The bus bar is provided on the base portion with a slit portion adapted to receive an end of the terminal of an electrical element and with an elastic tongue piece adapted to elastically contact with the terminal. When the terminal of an electrical element is inserted into the slit portion, the electrical element is connected through the bus bar to the circuit section of the circuit board.

According to the above construction, the circuit board terminal to which a terminal of the electrical element is connected is electrically coupled to the circuit section of the circuit board. That is, since the circuit board terminal is formed of a member different from the bus bar soldered on the circuit section on the circuit board and the circuit board terminal is elastically coupled through the elastic tongue piece to the bus bar, it is possible to reliably absorb a stress caused by inserting and drawing an electrical element into and from the circuit board terminal exerted between the circuit board terminal and the elastic tongue piece.

Also, the holding member may be provided with a holding groove that restricts the inserted depth of the circuit board terminal and displacement of the inserted end of the circuit board terminal when an end of the terminal is inserted through the slit portion in the bus bar into the holding groove.

According to the above construction, it is possible to restrict the inserted depth and displacement after assembling to dispose the circuit board terminal in a desired position upon attachment of the terminal to the holding member. Therefore, it is possible to obtain a stable connection between the terminal of the electrical element and the circuit board terminal.

Moreover, the elastic tongue piece may extend from a periphery of the slit portion in an inserting direction of the circuit board terminal so that the elastic tongue piece contacts with and pushes the terminal outwardly when the terminal is inserted into the slit portion.

According to the above construction, it is possible to obtain a positive electrical connection between the circuit board terminal and the bus bar merely by inserting the circuit board terminal along the elastic tongue piece upon assembling the terminal in the slit portion.

In more detail, elastic tongue pieces are provided on the opposed positions on the periphery of the slit portion so that the elastic tongue pieces can clamp the circuit board terminal on the opposite sides.

According to the above construction, the elastic tongue pieces can absorb the displacement and an electrical connection between the circuit board terminal and the elastic tongue pieces can be reliably obtained, even if the circuit board terminal is displaced fore and aft with respect to the elastic tongue pieces upon inserting and drawing an electrical element into and from the terminal, since the circuit board terminal is elastically clamped at the opposite sides by the elastic tongue pieces.

It will be apparent from the foregoing that in the structure for attaching the circuit board terminal to the circuit board in accordance with exemplary embodiments of the present invention, since the circuit board terminal to be connected to an electrical element is formed from a different member than the bus bar which is soldered on the circuit section on the circuit board, the soldered portion is not subject to a stress upon inserting and drawing the electrical element into and from the circuit board terminal and it is possible to reliably restrict the soldered portion from being cracked. Also, since the circuit board terminal is coupled through the elastic tongue piece to the circuit section, it is possible to accomplish a reliable electrical connection between the circuit board terminal and the circuit section while the elastic tongue piece can absorb the stress upon inserting and drawing the electrical element into and from the terminal.

BRIEF DESCRIPTION OF THE DRAWINGS

Exemplary embodiments are described in detail below with reference to the drawings, in which like numerals repeat like parts, and wherein.

DETAILED DESCRIPTION OF EMBODIMENTS

Exemplary embodiments in accordance with the present invention will be explained below by referring to the drawings.

Figure 1:
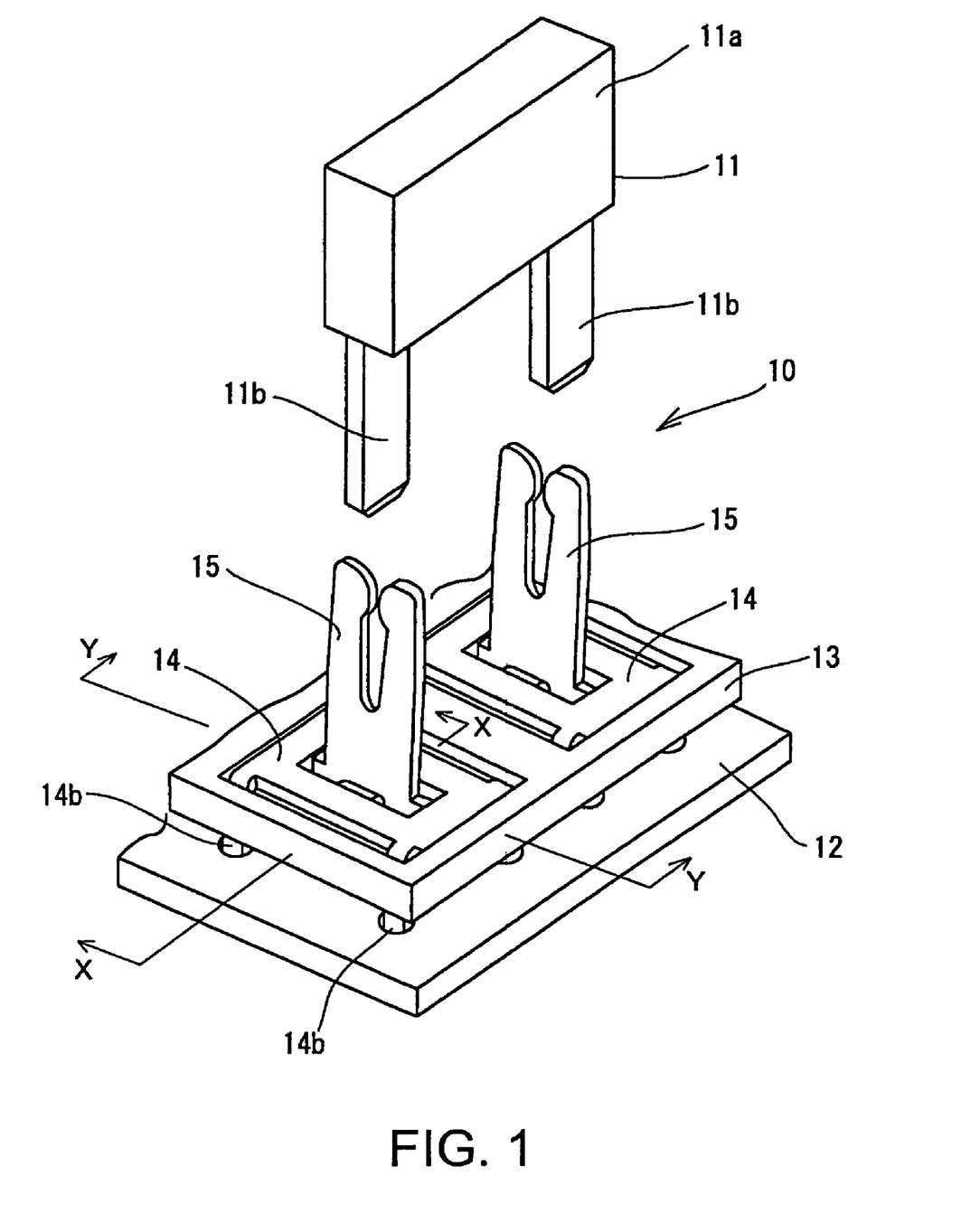
FIG. 1 is an exploded perspective view of a structure for attaching a circuit board terminal to a circuit board in accordance with an exemplary embodiment of the present invention.

FIGS. 1 to 5 show a structure for attaching a circuit board terminal to a circuit board in accordance with the present invention. FIG. 1 shows an example of a connection structure 10 adapted to receive an electrical element such as a blade type fuse 11 having a pair of terminals 11b that extend downward from a body portion 11a. The connection structure 10 includes a circuit board 12 provided on a predetermined lower surface with circuit sections 12a (see FIG. 3), a holding member 13 made of an insulation material and disposed above the circuit board 12 at a given distance spaced away from the circuit board 12, a bus bar 14 mounted on the holding member 13 and soldered on the circuit sections 12a, and circuit board terminals 15 to be connected to the fuse 11 and bus bar 14. A pair of circuit board terminals 15 are spaced away from each other at a distance corresponding to a distance between the terminals 11b of the fuse 11.

Figure 2:
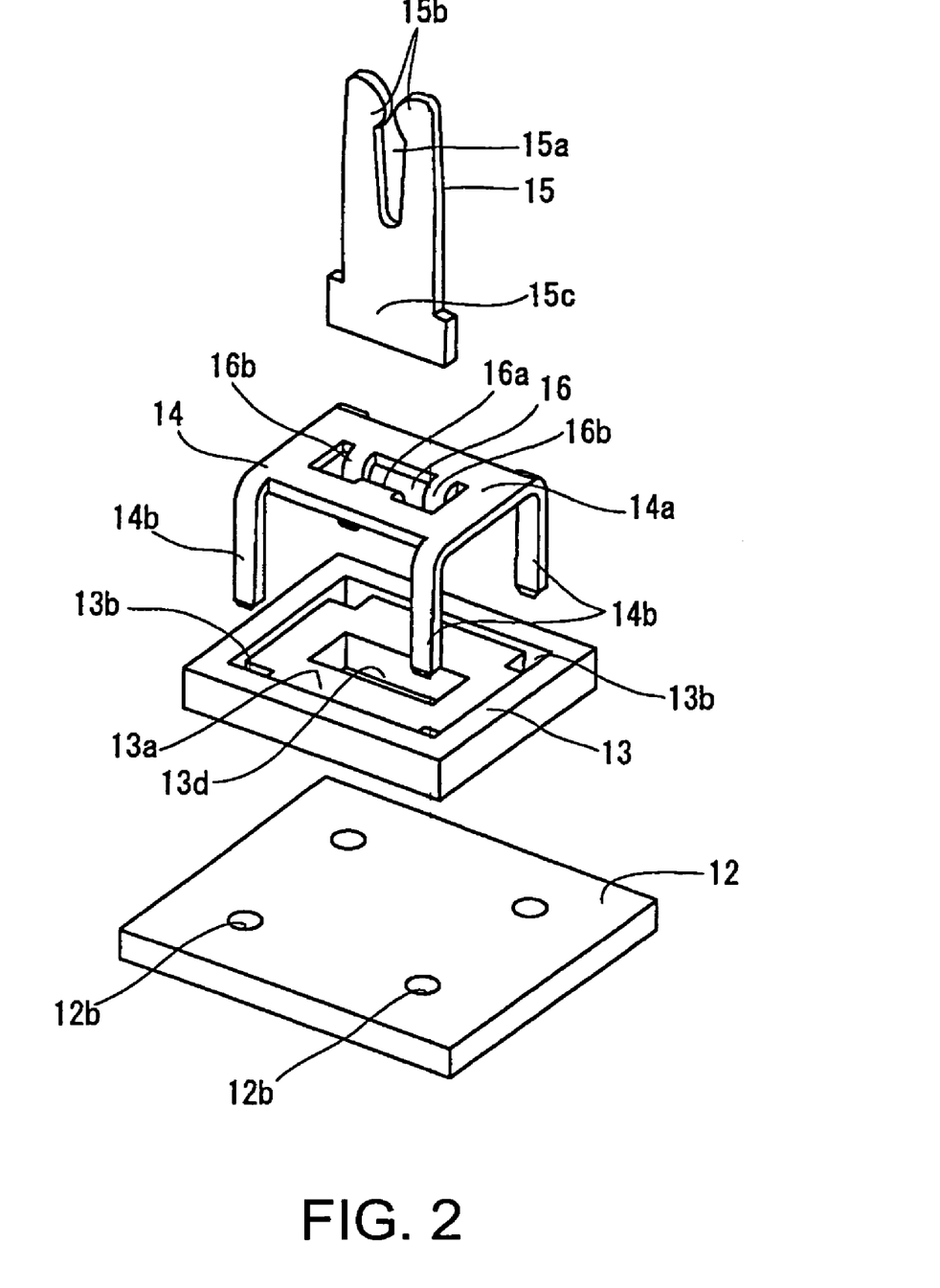
FIG. 2 is an exploded perspective view of a main part of the structure.
Figure 3A:
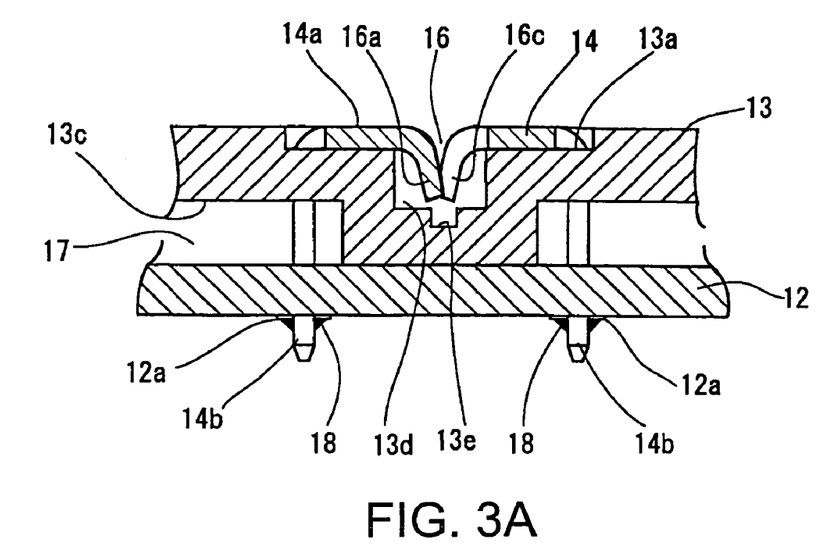
FIG. 3A is a sectional view of the structure taken along line X—X in FIG. 1, illustrating an arrangement before insertion of a circuit board terminal.
Figure 3B:
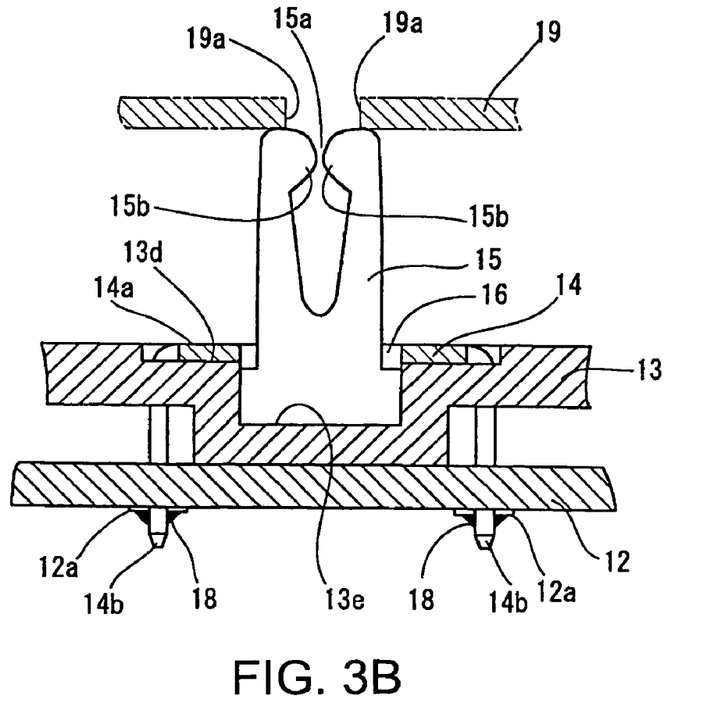
FIG. 3B is a sectional view of the structure taken along line Y—Y in FIG. 1, illustrating an arrangement after insertion of the circuit board terminal.

FIGS. 2 and 3 show detailed constructions of one side of the circuit board 12 in the connection structure 10. Punching a sheet of a metal plate forms a circuit board terminal 15. The terminal 15 has a tuning fork configuration. The circuit board terminal 15 is provided on an upper portion with a slit-like socket portion 15a that is adapted to receive the terminal 11b of the fuse 11 and on a lower portion with a base portion 15c to be connected to the bus bar 14. Press contact portion 15b is formed on each of opposed inner surfaces of the socket portion 15a. A distance between the press contact portions 15b is slightly smaller than a thickness of the circuit board terminal 15. The respective press contact portions 15b contact forcedly with the opposite surfaces of the circuit board terminal 15 inserted into the socket portion 15a to make an electrical connection.

Punching and bending a sheet of a metal plate forms the bus bar 14. The bus bar 14 includes a flat, rectangular base portion 14a and four elongated leg portions 14b extending downward from the four corners of the base portion 14a. The leg portions 14b are inserted into four through-holes 12b in the circuit board 12, respectively and soldered on the circuit section 12a. The base portion 14a is provided in a center part with a slit portion 16 to receive a lower portion of the circuit board terminal 15. The slit portion 16 is provided on the periphery with three elastic tongue pieces 16a, 16b, and 16c that are separated from one another and directed to an inserting direction of the circuit board terminal 15 so as to face the opposite surfaces of the terminal 15.

A central elastic tongue piece 16a faces one side of the circuit board terminal 15 while two opposite elastic tongue pieces 16b and 16c face the other side of the terminal 15. The piece 16a is shifted from the pieces 16b and 16c. The elastic tongue pieces 16a, 16b, and 16c are slanted downward and directed toward each other under a normal condition so that a distance between the pieces 16a to 16c is set to be smaller than a thickness of the circuit board terminal 15 as the pieces extend down. When the terminal 15 is inserted into the slit portion 16, the elastic tongue pieces 16a to 16c elastically contact with and hold the terminal 15 at the opposite sides.

The holding member 13 is made of a synthetic resin material and provided on the top surface with a recess containing portion 13a to receive the base portion 14a of the bus bar 14 and in the four corners with through-holes 13b to oppose the through-holes 12b of the circuit board 12 so that the leg portions 14b of the bus bar 14 can pass through-holes 12b and 13b. The holding member 13 is provided on the bottom surface around the through-holes 13b with recesses 13c. The recesses 13c define a given clearance 17 between the circuit board 12 and the holding member 13.

The holding member 13 is provided in a central part with a containing space 13d for accommodating the elastic tongue pieces 16a, 16b, and 16c to oppose the slit portion 16 in the bus bar 14. A holding groove 13e is formed at a bottom side of the containing space 13d. The holding groove 13e serves to confine the depth in insertion of the terminal for board 15 and to constrain displacement of the inserted end of the circuit board terminal 15, when the end of the circuit board terminal 15 is inserted through the slit portion 16 into the holding groove 13e.

As shown in FIG. 3B, the circuit board terminal 15 inserted in the space defined by the elastic tongue pieces 16a, 16b, and 16c is restricted from coming out from the pieces by contacting the upper end edge of the circuit board terminal 15 with, for example, a stopper portion 19a of an external casing 19.

Next, a process for assembling a structure for attaching a circuit board terminal to a circuit board in accordance with the present invention will be described below.

Figure 4A:
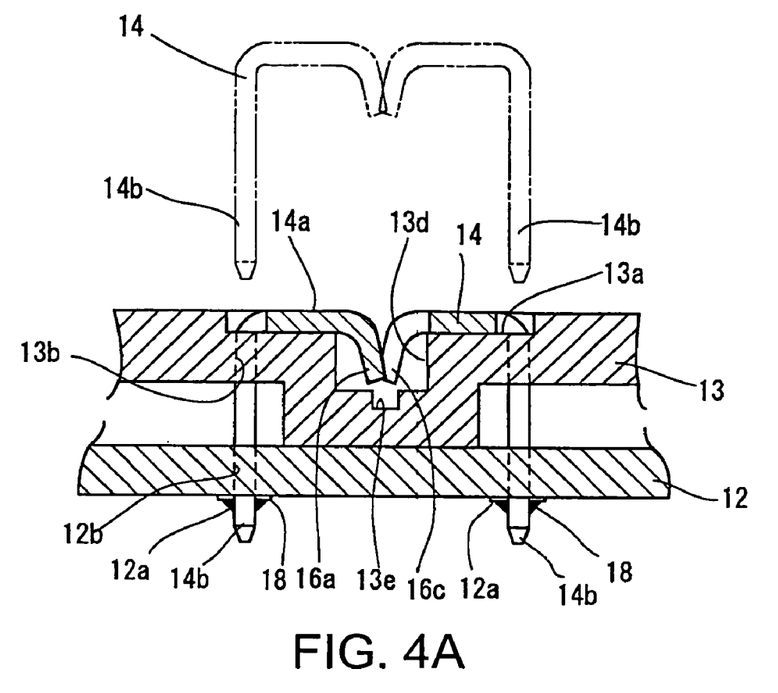
FIG. 4A is a sectional view of the structure for attaching a circuit board terminal to a circuit board, illustrating steps of assembling the structure.

Firstly, as shown in FIG. 4A, after mounting the holding member 13 on the circuit board 12, the leg portions 14b of the bus bar 14 are inserted into the through-holes 13b in the holding member 13 and the through-holes 12b in the circuit board 12, and the base portion 14a engages the containing portion 13a to position the bus bar 14. Then, the lower ends of the leg portions 14b that extend downward from the through-holes 12b in the circuit board 12 are soldered on the circuit section 12a to form soldered portions 18, thereby securing the bus bar 14 to the circuit board 12.

Figure 4B:
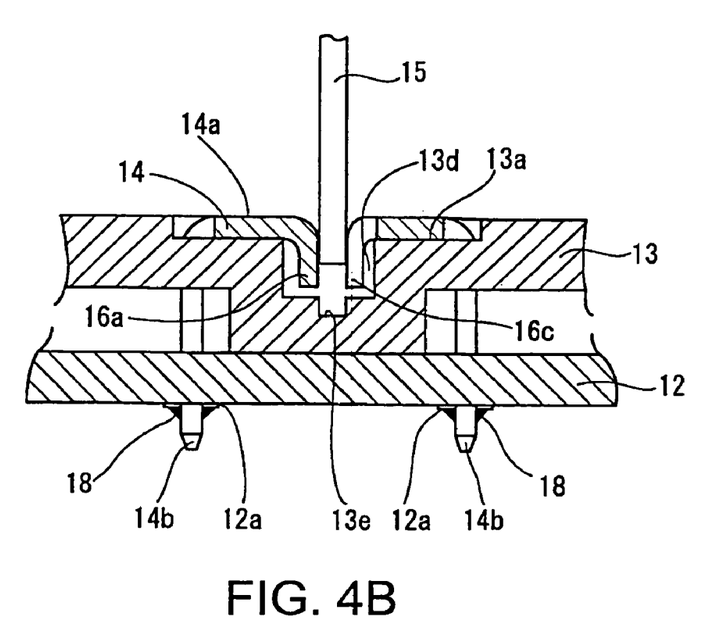
FIG. 4B is a sectional view of the structure for attaching a circuit board terminal to a circuit board, illustrating steps of assembling the structure.
Figure 5A:
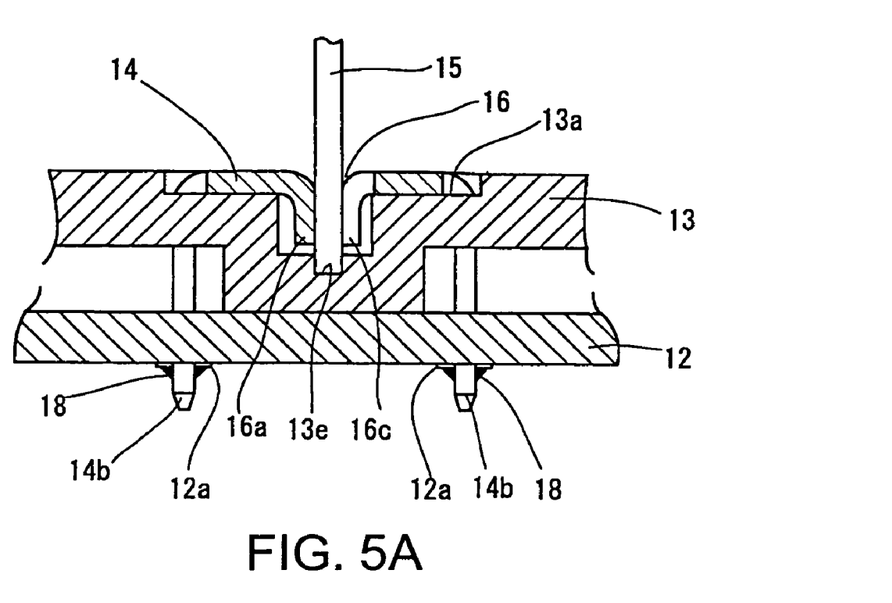
FIG. 5A is a sectional view of the structure, illustrating an arrangement after attachment of the circuit board terminal.
Figure 5B:
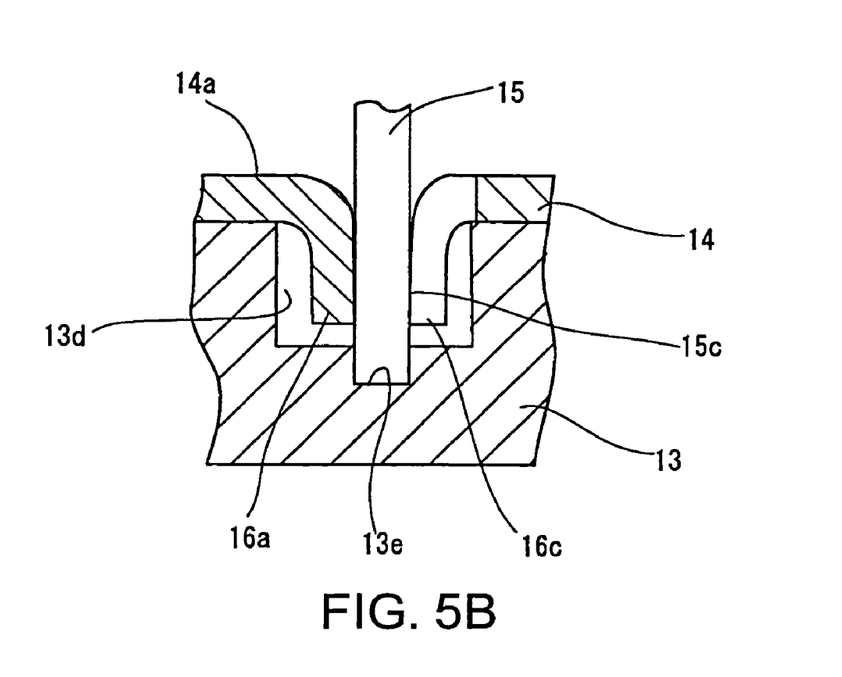
FIG. 5B is a sectional view of a main part of the structure shown in FIG. 5A.

Next, as shown in FIG. 4B, the lower ends of the circuit board terminal 15 are inserted into the space defined among the elastic tongue pieces 16a, 16b, and 16c on the slit portion 16 in the bus bar 14. Then, the circuit board terminal 15 moves down into the slot portion 16 while widening the gaps between the elastic tongue pieces 16a to 16c against the elasticity of the elastic tongue pieces 16a to 16c. As shown in FIGS. 5A and 5C, when the lower end of the circuit board terminal 15 is inserted into the holding groove 13e, the lower end of the terminals 15 is confined with respect to the inserting depth and constrained with respect to displacement. In this condition, the base portions 15c of the circuit board terminal 15 are clamped elastically at the opposite sides by the elastic tongue pieces 16a, 16b, and 16c, thereby maintaining an electrical connection of high reliability.

Terminals 11b of an electrical element such as a fuse 11 and the circuit board terminal 15 are electrically coupled to each other in a press contact condition, when the respective terminals 11b of the fuse 11 are pushed through the press contact portions 15b into the socket portion 15a in the circuit board terminal 15 assembled by the manner described above, as shown in FIG. 1. Thus, when the fuse 11 is inserted into or drawn out from the circuit board terminal 15, the terminal 15 are subject to a stress upon inserting or drawing action. However, the circuit board terminal 15 is not directly, but indirectly, through the bus bar 14, connected to the circuit section 12a. Accordingly, the stress caused by the action of inserting and drawing the fuse 11 is absorbed by the elasticity of the elastic tongue pieces 16a, 16b, and 16c of the bus bar 14 and the stress caused by the action of inserting and drawing the circuit board terminal 15 does not affect soldered portions 18 directly, thereby reliably restricting the soldered portions 18 from being cracked. Since four soldered portions 18 can be provided on the circuit board 12a, it is possible to further enhance reliability in connection between the circuit board 12 and the circuit board terminal 15 through the circuit section 12a and bus bar 14.

Figure 6A:
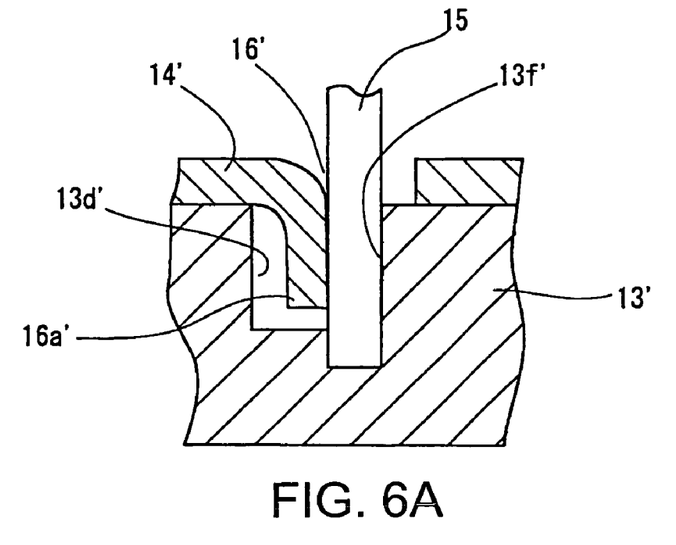
FIG. 6A is a sectional view of an alteration of the structure.

Although in an elastic contact structure including the elastic tongue pieces 16a, 16b, and 16c of the bus bar 14 and the circuit board terminal 15 in the above embodiment, the elastic tongue pieces 16a, 16b, and 16c clamp the opposite sides of the circuit board terminal 15, only a single elastic tongue piece 16a' may contact with the circuit board terminal 15, as shown in an alteration in FIG. 6A. That is, the elastic tongue piece 16a' may extend from one side of the slit portion 16', an inner peripheral wall 13f in a containing space 13d' of a holding member 13' may be opposed to the elastic tongue piece 16a', and an elastic force exerted in the elastic tongue piece 16a' may push the circuit board terminal for board 15 onto the inner periphery wall 13f, thereby accomplishing an electrical connection between the bus bar and the circuit board terminal.

Also, although the four leg portions 14b of the bus bar 14 are soldered on the circuit section 12a of the circuit board 12 in the above embodiment, a single leg portion or plural leg portions may be provided.

Figure 6B:
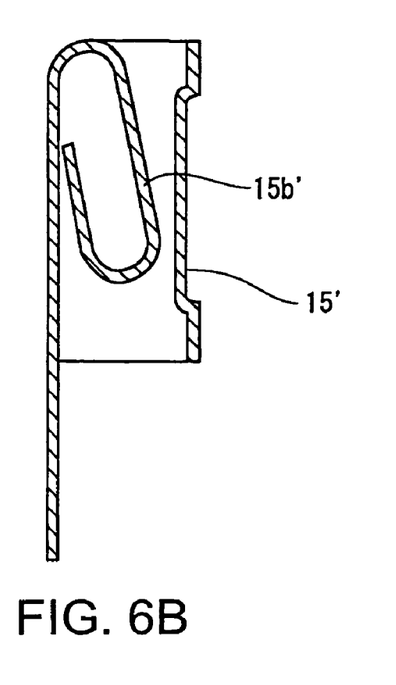
FIG. 6B is a sectional view of an alteration of the circuit board terminal.

Further, although the fuse 11 is exemplified as the electrical element in the above embodiment, the electrical element may be another electrical element such as a relay, a connector, or the like. Although the depicted circuit board terminal 15 to be connected to the electrical element has a tuning fork-like configuration, the circuit board terminal may be a female type circuit board terminal 15' having an elastic contact portion 15b' that can receive a male tab of a mating element. Accordingly, the circuit board terminal may be any different type terminal configuration.

While the invention has been described in conjunction with specific embodiments, these embodiments should be viewed as illustrative and not limiting. Various changes, substitutes, improvements or the like are possible with the spirit and scope of the invention.

What is claimed is:

1. A structure for attaching a circuit board terminal to a circuit board, comprising:
    a circuit board provided with a predetermined circuit section; a holding member made of an insulation material and mounted on and secured to the circuit board; a bus bar made of a metallic material and having a base portion supported on the holding member and a leg portion that passes a through-hole formed in the holding member and the circuit board to be soldered on the circuit section; and
    a circuit board terminal that has a base portion to be connected to the bus bar and a connection portion adapted to be coupled to a terminal of an electrical element;
    wherein the bus bar is provided on the base portion with a slit portion adapted to receive an end of the circuit board terminal and with an elastic tongue piece adapted to elastically contact with the circuit board terminal, and wherein when the circuit board terminal is inserted into the slit portion, the circuit board terminal is connected through the bus bar to the circuit section of the circuit board.

2. A structure for attaching a circuit board terminal to a circuit board, according to claim 1,
    wherein the holding member is provided with a holding groove that restricts an inserted depth of the circuit board terminal and displacement of an inserted end of the circuit board terminal when an end of the circuit board terminal is inserted through the slit portion in the bus bar into the holding groove.

3. A structure for attaching a circuit board terminal for board to a circuit board, according to claim 1,
    wherein the elastic tongue piece extends from a periphery of the slit portion in an inserting direction of the circuit board terminal so that the elastic tongue piece contacts with and pushes the circuit board terminal outwardly when the circuit board terminal is inserted into the slit portion.

4. A structure for attaching a circuit board terminal to a circuit board, according to claim 1,
    wherein elastic tongue pieces are provided at opposed positions on the periphery of the slit portion so that the elastic tongue pieces can clamp the circuit board terminal at opposite sides.

* * * * *